United States Patent [19]

Hattori

[11] Patent Number: 5,051,772
[45] Date of Patent: Sep. 24, 1991

[54] COLOR IMAGE RECORDING APPARATUS

[75] Inventor: Tomoaki Hattori, Nagoya, Japan

[73] Assignee: Brother Kogyo Kabushiki Kaisha, Japan

[21] Appl. No.: 592,958

[22] Filed: Oct. 3, 1990

[30] Foreign Application Priority Data

Oct. 20, 1989 [JP] Japan .................. 1-274357

[51] Int. Cl.$^5$ ............................................. G03B 27/32
[52] U.S. Cl. ...................................... 355/32; 355/27; 355/35; 355/77; 355/313; 355/311
[58] Field of Search ................... 354/302; 355/27, 32, 355/35, 77, 206, 313, 314, 311

[56] References Cited

U.S. PATENT DOCUMENTS

| | | | |
|---|---|---|---|
| 4,878,084 | 10/1989 | Hayakawa et al. | 355/27 |
| 4,884,082 | 11/1989 | Sonoda et al. | 346/105 |
| 4,922,286 | 5/1990 | Tanabe | 355/27 |
| 4,949,185 | 8/1990 | Nakai | 358/300 |

Primary Examiner—A. T. Grimley
Assistant Examiner—Patrick J. Stanzione
Attorney, Agent, or Firm—Oliff & Berridge

[57] ABSTRACT

A color image recording apparatus includes an exposing unit for exposing a photosensitive recording medium to light through a succession of mask members prepared based on colored image information to form an image on the photosensitive recording medium. The apparatus further includes a stop signal input unit for inputting a stop signal to interrupt the image recording operation, a mask member ejecting unit for ejecting all the mask members from the image recording apparatus when the stop signal input unit provides a stop signal, and a photosensitive recording medium changing controlling unit for changing the photosensitive recording medium for a new one if the latent image forming process has been started by the exposing unit before the stop signal is provided by the stop signal input unit.

17 Claims, 5 Drawing Sheets

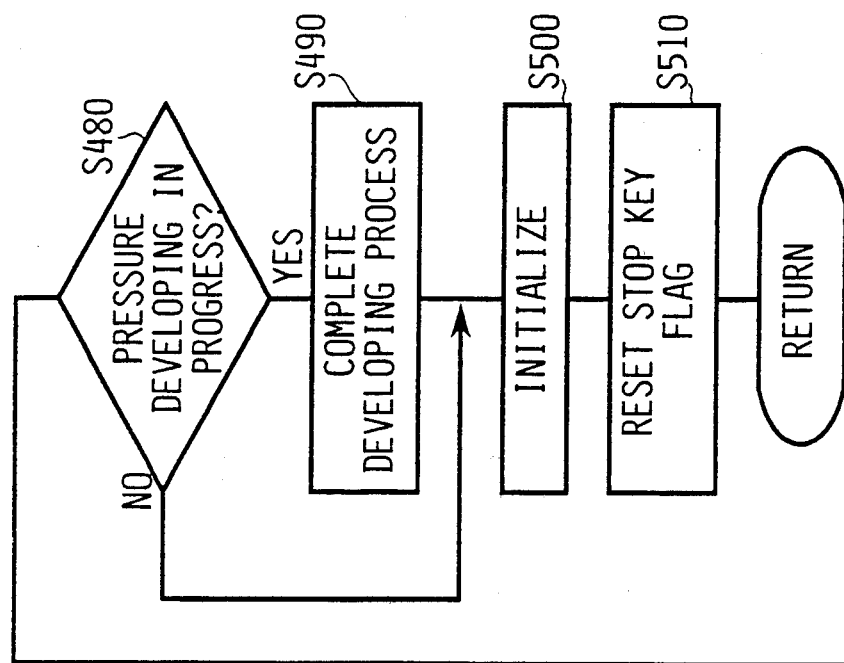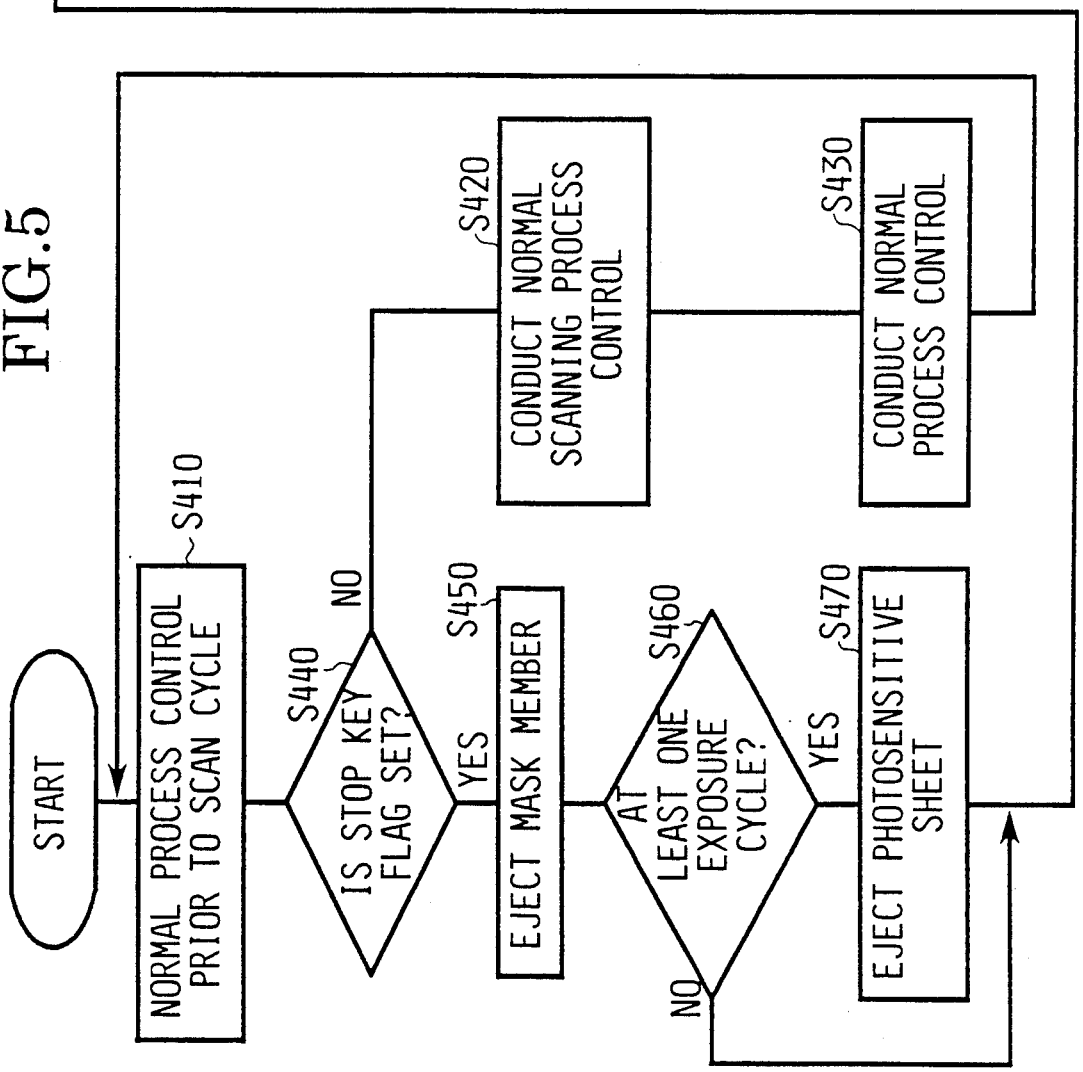
FIG.5

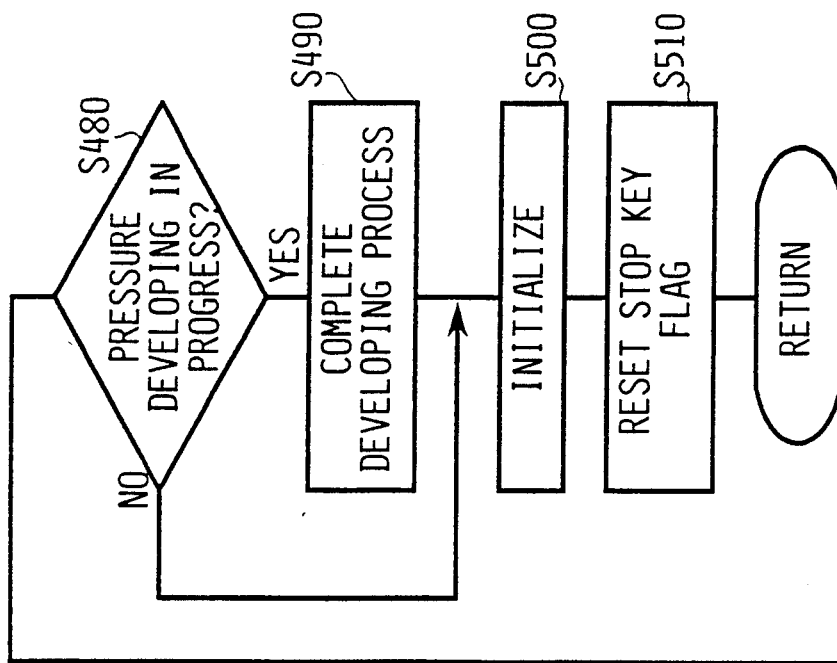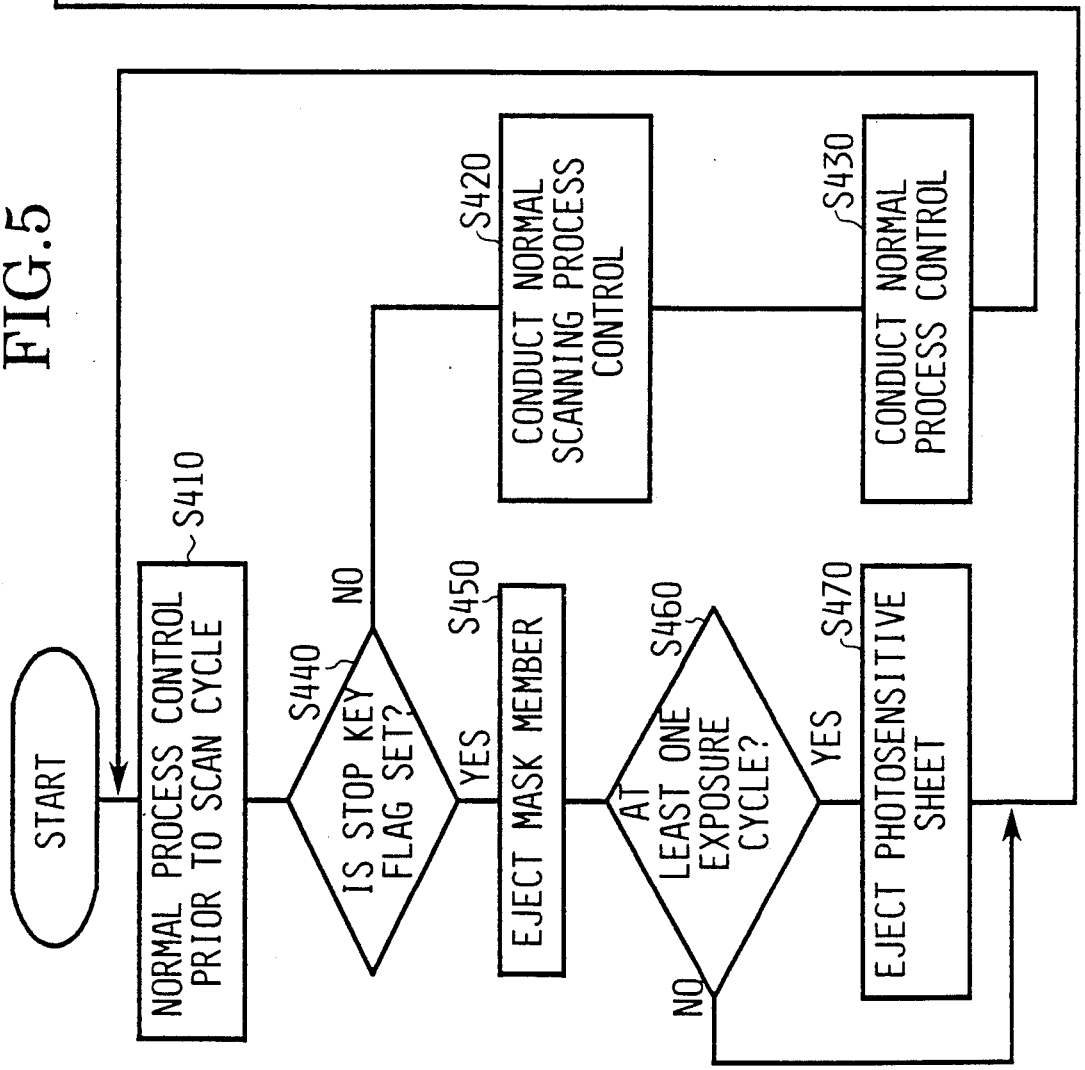

COLOR IMAGE RECORDING APPARATUS

BACKGROUND OF THE INVENTION

1. Field of the Invention

The present invention relates to a color image recording apparatus for recording a colored image on a photosensitive recording medium.

2. Description of the Related Art

One conventional method for recording a colored image on a color photosensitive recording medium (hereinafter also referred to as "photosensitive sheet") employs color separation filters of red (R), green (G) and blue (B) for producing color-separated mask members from an original color image. The photosensitive sheet is exposed to light successively through these mask members. There is also known a process for applying white light directly to a colored original image and exposing a photosensitive sheet to light reflected by the colored original image. The former colored image recording method is more efficient than the latter process in that the intensity of exposure energy required to be applied to the photosensitive recording medium by the former method is much smaller than that required by the latter process.

One inhouse proposal has been made with respect to a color image recording apparatus for electrophotographically producing mask members using toner as a light-shielding substance on a light transmissive sheet, and exposing a photosensitive sheet to light through such mask members for reproducing a colored image on the photosensitive sheet.

Further, a subsequent inhouse proposal has been made (as described in U.S. Pat. No. 4,884,082) regarding a color image recording apparatus for producing mask members using a commercially available monochromatic printer such as a laser beam printer, and reproducing a colored image in the same manner as disclosed in the above proposal. In the recording apparatus disclosed in U.S. Pat. No. 4,884,082, the mask members of red (R), green (G) and blue (B) are printed on ordinary paper sheets of cut form by the monochromatic printer, and monochromatic lights of red (R), green (G) and blue (B) are applied successively to a photosensitive recording medium through the mask members Since the mask members are produced on ordinary plane papers, maintenance and handling of the mask members are facilitated, and the mask members are convenient to use especially when a number of colored images are to be produced using the same mask members or a colored image is to be reproduced at a later time using the mask members.

There has been also another inhouse proposal regarding an image recording apparatus in which mask members produced on respective cut sheets have respective identification marks indicating the colors of the mask members. This apparatus has a sensor for reading the identification marks on the mask members that have been delivered to an exposure position, so that the colors of lights to be applied through the mask members to a photosensitive sheet can automatically be selected so as to correspond to the mask members in use. This apparatus allows the photosensitive sheet to be exposed to light of desired colors irrespective of the sequence in which the mask members may be delivered to the exposure position. Therefore, the mask members may be manufactured in any desired order by a monochromatic printer, and the manufactured mask members may be inserted in any desired order into the color image recording apparatus, since a colored light corresponding to the applied mask member is irradiatable.

Further, in U.S. Pat. No. 4,884,082 which discloses the color image recording apparatus using the mask members, a mask member circulating passage is provided for repeatedly feeding the mask members to the exposure position end for positioning them when a number of colored images are to be reproduced from one set of such mask members. With the mask member circulating passage, it is not necessary to prepare mask members again on a monochromatic printer or to insert the mask members manually into a mask member feeder each time a colored image is to be reproduced. Consequently, color images can be recorded at a high speed.

In some cases, a desired image is not recorded due to the use of a wrong mask member in continuously operating the image recording apparatus to record the same color image on a plurality of image recording media. In such a case, the image recording operation must be interrupted immediately to avoid useless image recording operation. The interruption of the image recording operation is important particularly to the image recording apparatus in view of saving materials because the image recording apparatus consumes mask members and many sheets including photosensitive sheets and developing sheets.

However, the appropriate timing for stopping the image recording apparatus without causing jamming or clogging has been difficult because these sheets are conveyed along a complicated path through the image recording apparatus and different processes are carried out simultaneously. Accordingly, it has been impossible to stop the image recording apparatus before producing a set number of copies.

Naturally, the image recording apparatus can be stopped by opening the main switch or by opening the cover, provided that the image recording apparatus may be stopped regardless of the current condition of the image recording processes. For example, if the image recording apparatus is stopped while the mask member is being changed, the mask member is held at a random position, which often causes jamming. If the mask member is jammed within the image recording apparatus, the jammed mask member must be removed by hand to restore the image recording apparatus to its normal condition. If the image recording apparatus is stopped while conducting a pressure developing process, in which a photosensitive recording sheet and a developing sheet are pressed together, it is possible that the photosensitive sheet and the developing sheet adhere to each other.

SUMMARY OF THE INVENTION

In view of the aforesaid shortcomings of the inhouse image recording apparatus, it is an object of the present invention to provide a color image recording apparatus which can be stopped while the image recording process is in progress to save the materials and can smoothly be restarted.

According to the present invention, these and other objects can be attained by providing a color image recording apparatus, which comprises an exposing means for exposing a photosensitive recording medium to light through a succession of mask members prepared based on colored image information to form an image on the photosensitive recording medium, a stop signal input means for inputting stop signal to interrupt the image recording operation, a mask member ejecting means for ejecting all the mask members from the image recording apparatus when the stop signal input means provides a stop signal, and a photosensitive recording medium changing controlling means for changing the photosensitive recording medium if the latent image forming process has been started by said exposing means before the stop signal is provided by the stop signal input means.

With the above arrangement, when the stop signal input means provides a stop signal, the mask member ejecting means ejects all the mask members. The photosensitive recording medium existing within the image recording apparatus is removed, regardless of how little the photosensitive recording medium has been exposed by said exposing means. That is, if the photosensitive recording medium is in the latent image forming process, a new photosensitive recording medium is supplied.

BRIEF DESCRIPTION OF THE DRAWINGS

The above and other objects, features and advantages of the present invention will become more apparent from the following description when taken in conjunction with the accompanying drawings in which a preferred embodiment of the present invention is shown by way of illustrative example; and wherein:

FIG. 3 is a flow chart of a stop key interrupt routine to be executed by the controller of FIG. 2;

FIG. 5 is a flow chart of a main routine to be executed by the controller of FIG. 2.

DETAILED DESCRIPTION OF THE PREFERRED EMBODIMENTS

Figure 1:
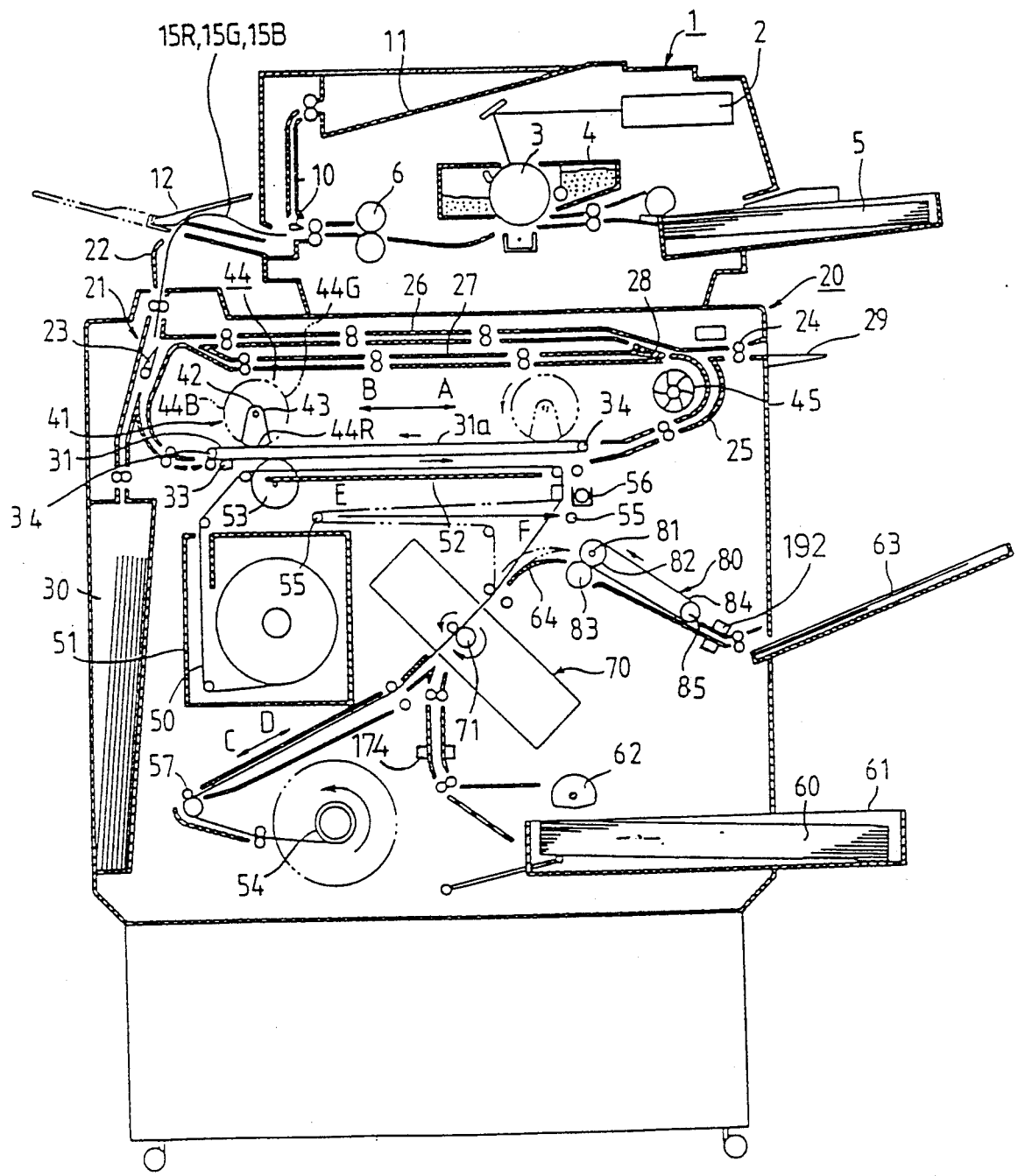
FIG. 1 is a schematic vertical cross-sectional view showing a color image recording apparatus according to the present invention.

FIG. 1 shows a color image recording apparatus 20 according to the present invention which is coupled to a monochromatic laser printer 1.

The laser printer 1 is placed on the top of the color image recording apparatus 20. The laser printer 1 has a polygon scanner 2 which applies a laser beam to an electrically charged photosensitive member such as a drum 3 to form an electrostatic latent image thereon. The electrostatic latent image on the photosensitive member 3 is then developed into a visible toner image by a developing unit 4. The toner image is thereafter transferred from the photosensitive drum 3 onto a sheet of a plane paper or an OHP sheet supplied from a sheet cassette 5, and then fixed by a fixing unit 6. The monochromatic laser printer 1 records data transmitted from a host computer (not shown) on sheets.

If a black-and-white image (monochromatic output image) is to be reproduced, then the printed sheet from the laser printer 1 is discharged by a sheet path selector 10 onto a discharge tray 11 or 12. If a colored image is to be reproduced, then the printed sheet from the laser printer 1 is first discharged onto the discharge tray 12, and then fed into the color image recording apparatus 20.

The distal end of the discharge tray 12 is angularly movable between a solid line position and a chain line position as shown in FIG. When it is in the solid-line position, the printed sheet from the laser printer 1 is guided into the color image recording apparatus 20. A set of three monochromatically printed sheets from the laser printer 1 is used as a set of mask members 15R, 15G, 15B (also referred to collectively as a mask member or members 15) in the color image recording apparatus 20.

The construction of the color image recording apparatus 20 will be described below.

The color image recording apparatus 20 has a mask member feeder 21 disposed in an upper portion in an apparatus housing. The mask member feeder 21 includes a positioning unit 31, a circulation guide 25, and two parallel upper and lower storage trays 26, 27, which are coupled in a circulatory pattern. The junction between the positioning unit 31 and the storage trays 26, 27 is connected to the discharge tray 12 of the monochromatic laser printer through a guide member 22, so that a printed sheet (mask member) from the monochromatic laser printer 1 is introduced into the mask member feeder 21.

The mask member feeder 21 includes a swingable gate 23 for selectively directing a mask member 15, which has been guided by the guide member 22, toward the positioning unit 31 or a discharge tray 30. Further, a swingable gate 28 is disposed between the circulation guide 25 and the storage trays 26, 27. The gate 28 directs a mask member 15, which has been guided by the circulation guide 25, into the upper storage tray 26 or the lower storage tray 27. A mask member 15 which has been inserted from a manual feed tray 29 can be introduced into the mask member feeder 21 through a gate 24.

The feed belt 31a of the positioning unit 31 is in the form of an endless belt made of a light-transmissive dielectric material such as polyethylene terephthalate (PET) The feed belt 31a is trained around two spaced shafts 34. At least one of the shafts 34 is rotatable about its own axis by a motor (not shown) for circulating the belt 31a in the direction indicated by an arrow in FIG. 1. The surface of the feed belt 31a is electrically charged by an electric charger such as a corotron (not shown) for electrostatically attracting the mask member 15. A sensor bar 33 supporting positioning mark sensors 33a (FIG. 2) and mask member identifying mark sensors 33b (FIG. 2) is positioned near one end of the feed belt 31a. The positioning mark sensors serve to read positioning marks printed on predetermined portion of a mask member 15 for locating the mask member 15 in a given position, and the mask member identifying mark sensors serve to identify the color of the mask member 15.

Figure 4A:
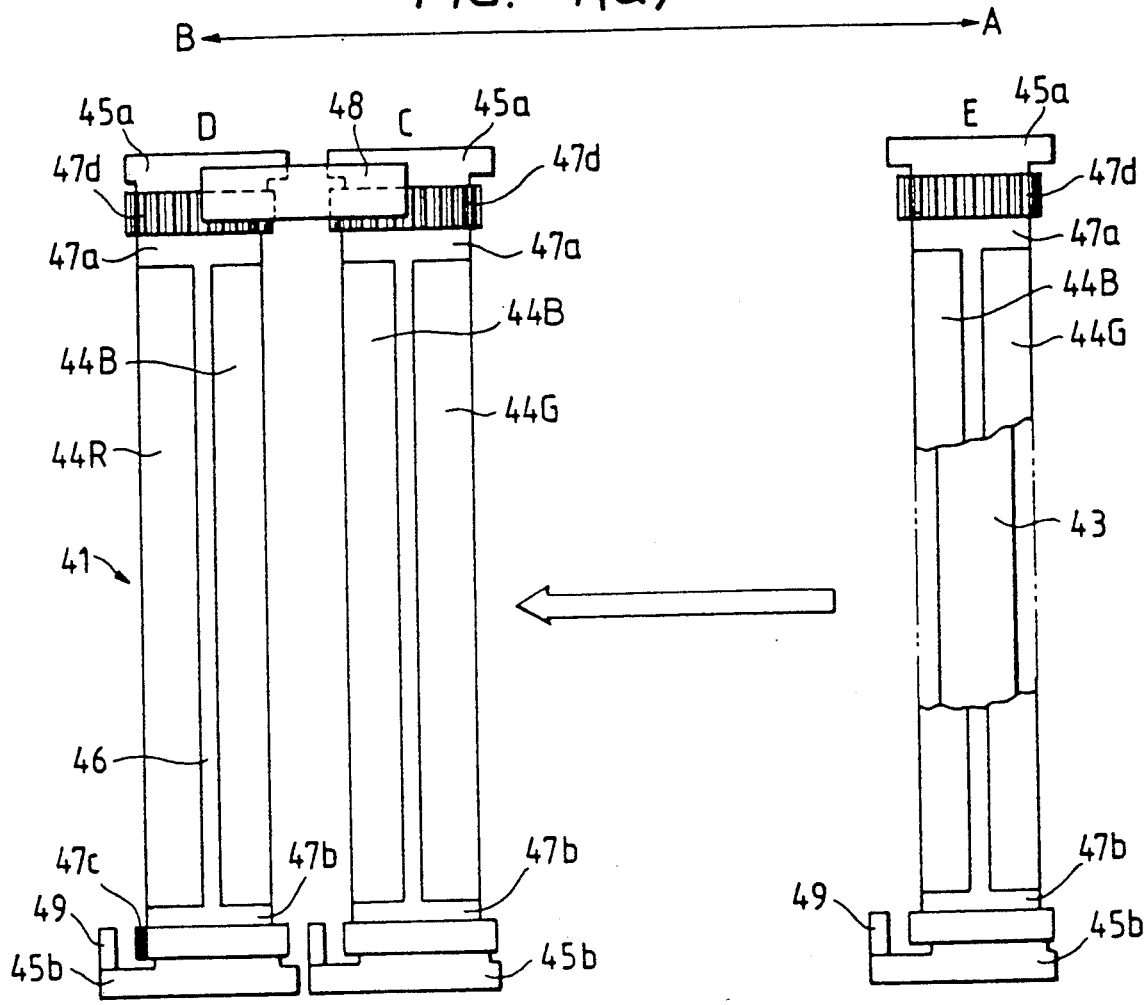
FIGS. 4(a) and 4(b) are plan and cross-sectional views of the exposure device, the views showing the manner in which the exposure device moves over its stroke and switches color separation filters.

An exposure device 41 is disposed above the positioning unit 31. The exposure device 41 is movable horizontally along the positioning unit 31. FIGS. 4 (a) and 4 (b) illustrate the exposure device 41 in greater detail.

The exposure device 41 comprises a linear light source 42 which emits white color light, a reflecting member 43 for reflecting light from the light source 42 in one direction, a cylindrical frame 46 having three independent openings defined therein at substantially equal circumferential intervals and supporting color separation filters 44R, 44G, 44B of red, green, blue therein, a pair of axially spaced cylindrical supports 47a, 47b supporting the frame 46 and rotatable therewith, the cylindrical support 47a supporting a gear 47d on its outer end, and a pair of axially spaced rectangular frames 45a, 45b on which the respective supports 47a, 47b are rotatably supported. The frames 45a, 45b are joined to each other by a tie plate (not shown), thus making the exposure device 41 unitary in structure.

One of the color separation filters 44R, 44G, 44B is positioned in the opening of the reflecting member 43, i.e., directly below the light source 42. In the illustrated embodiment of FIGS. 4(a) and 4(b), the filter 44R is positioned below the light source 42. The exposure device 41 is movable reciprocally in the directions indicated by arrows A, B by means of a suitable actuator (e.g., scanner motor 105 which is part of the lamp moving unit 111 (FIG. 2) controlled by controller 200) for applying light to a desired area on a photosensitive recording medium. The support 47a houses a one-way clutch (not shown) which allows the cylindrical frame 46 to rotate in the direction indicated by an arrow H only when the exposure device 41 moves back in the direction indicated by the arrow B from a position C to a home position D while the gear 47d on the support 47a is brought into meshing engagement with a fixed rack 48. When the cylindrical frame 46 is thus rotated, another color separation filter, here the filter 44G, is angularly moved into the position below the light source 42.

In operation, the exposure device 41 is moved in the direction indicated by the arrow A toward a position E at the righthand end of its stroke while light from the light source 42 is radiated out through the red filter 44R for scanning exposure. Thereafter, the light source 42 is deenergized, and the exposure device 41 is moved back in the direction indicated by the arrow B. On the backward stroke, the gear 47d on the support 47a meshes with the rack 48 in the position C, thus rotating the frame 46 in the direction indicated by the arrow H (FIG. 4(b)). When the exposure device 41 reaches the home position D, the next filter, particularly the green filter 44G, is positioned in the opening of the reflecting member 43 in preparation for a next cycle of scanning exposure.

Figure 4B:
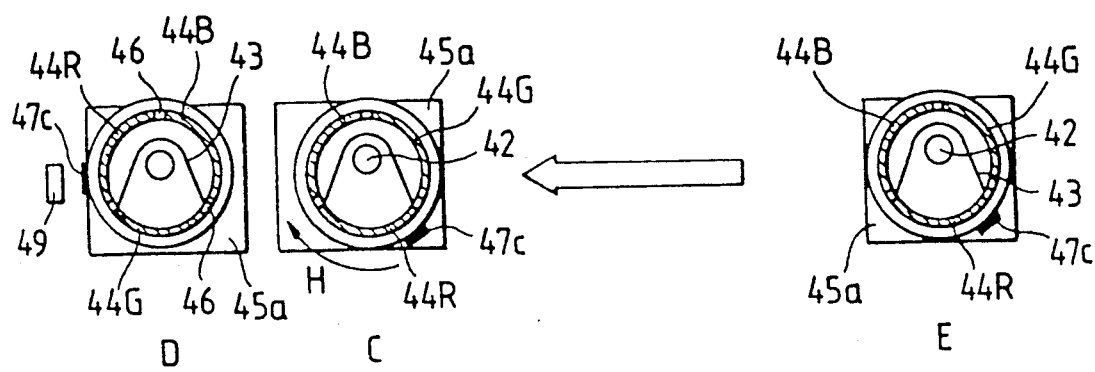

The support 47b has a reference filter position mark 47c for detecting the reference position of the filters 44R, 44G, 44B. A reference filter position sensor 49 is positioned such that it faces the reference position mark 47c when the exposure device 41 is in the home position D. The filter which is located directly below the light source 42 or in the opening of the reflecting member 43 can be determined by the controller 200 (described below) in conjunction with the sensor 49. In particular, the position of the position mark 47c provided on the support 47b is prescribed as the nearest position to the red filter 44R. As shown in FIG. 4(b), the blue filter 44B is provided at the left side of the red filter 44R and the green filter 44G is provided at the right side of the red filter 44R. And, when the reference filter position sensor 49 detects the reference position mark 47, the green filter 44G is located directly below the light source 42. When the reference filter position sensor 49 does not detect the reference position mark 47 and the position of the filter has been changed one time by the rack 48, the blue filter 44B is located directly below the light source 42. When the reference filter position sensor 49 does not detect the reference position mark 47 and the position of the filter has been changed two times by the rack 48, the red filter 44R is located directly below the light source 42. The control 200 (described below) includes suitable counters for detecting the number of times that the filter position is changed.

As described above, the color separation filters 44R, 44G, 44B are disposed around the linear light source 42 and the reflecting member 43, and are successively brought into the position below the light source 42 in response to the movement of the exposure device 41 itself over its stroke. Accordingly, the exposure device 41 is a space saver and is of a simple and inexpensive structure.

A photosensitive recording medium or sheet 50 is primarily made of a photosetting resin including a photopolymerization initiator. More specifically, the photosensitive recording medium 50 comprises a base sheet coated with photo-curable resins which will be photo-cured upon exposure to light having wavelengths of red, green and blue, and microcapsules containing dye precursors of cyan, magenta and yellow. The photosensitive recording medium 50 is housed in a supply roll in a cartridge 51 in a light shielded condition. The photosensitive recording medium 50 which is drawn out of the cartridge 51 passes between the belt 31a and an exposure table 52, goes past a fastening roller 56, a tension roller 55, a movable guide 64, a pressure developing unit 70, and a drive roller 57, and is wound around a takeup roller 54. When the photosensitive recording medium 50 is to be exposed to light from the exposure device 41, the exposure table 52 is elevated by a cam 53 to bring the photosensitive recording medium 50 into close contact with a mask member 15 which has been fed by the feed belt 31a. While an image is being developed by the pressure developing unit 70, the photosensitive recording medium 50 is gripped and fastened in position by the fastening roller 56, and is also prevented from sagging by the tension roller 55. The drive roller 57 serves to feed the photosensitive recording medium 50 at a constant speed.

A color developer sheet 60 comprises a base sheet coated with a color developer disclosed in U.S. Pat. No. 4,399,209 and Japanese Patent Application Kokai No. 58-88739, for example. A stack of such color developer sheets 60 is stored in a cassette 61 with their coated surfaces facing downwardly. The color developer sheets 60 are fed, one by one, from the cassette 61 by a feed roller 62 which is intermittently operated by an actuator (not shown), and supplied to the pressure developing unit 70. The supplied color developer sheet 60 is placed over the exposed area of the photosensitive recording medium 50, and pressed thereagainst by a pair of pressure rollers 71 in the pressure developing unit 70, whereupon a latent image which has been formed on the photosensitive recording medium 50 by exposure to light from the exposure device 41 is visualized on the color developer sheet 60.

A thermal fixing unit 80 comprises a heat roller 82 with a heater 81 disposed therein, an auxiliary roller 85, an endless belt 84 trailed around the heat roller 82 and the auxiliary roller 85, and a pinch roller 83 pressed against the heat roller 82 with the endless belt 84 therebetween. The color developer sheet 60 which has been fed from the pressure developing unit 70 and guided by the movable guide 64 is introduced into the thermal fixing unit 80 in which the color developer sheet 60 is calendered to fix the visualized image. The color developer sheet 60 is then discharged from the thermal fixing unit 80 onto a discharge tray 63. At the outlet of the thermal fixing unit 80, an ejecting photo detector 192 is disposed to detect the developer sheet 60. At the inlet of the pressure developing unit 70, a photo detector 174 is disposed to detect the developer sheet 60.

The color image recording apparatus 20 thus constructed operates as follows:

It is assumed that a red mask member 15R is produced by the monochromatic laser printer 1. The mask member 15R has a toner pattern thereon as a light-shielding image, and light passing through the mask member 15R, but not through its light-shielding image, photocures those microcapsules which contain a dye precursor of cyan on the photosensitive recording medium 50.

At this time, the discharge tray 12 of the monochromatic laser printer 1 is in the solid-line position. The produced mask member 15R is guided by the guide member 22 into the mask member feeder 21 in the color image recording apparatus 20.

The positioning unit 31 electrostatically attracts the mask member 15R to the feed belt 31a, and feeds the mask member 15R into an exposure position therein.

At the same time that the mask member 15R is thus positioned, the mask member identifying marks (not shown) on the mask member 15R are sensed by the corresponding sensors 33a, 33b (shown in FIG. 2) on the sensor ba-r/ 33, so that the color of the mask member 15R is detected by a control unit described below. If the filter positioned below the light source 42 of the exposure device 41 does not correspond to the mask member 15R, then, the exposure device 41 is reciprocally moved to angularly rotate the frame 46 until the proper filter 44R is positioned below the light source 42. Then, the photosensitive recording medium 50 is fastened by the fastening roller 56, and the cam 53 is rotated by an actuator (not shown) to elevate the exposure table 52. The photosensitive recording medium 50 is now held intimately against the feed belt 31a of the positioning unit 31 with the mask member 15R sandwiched therebetween.

Figure 2:
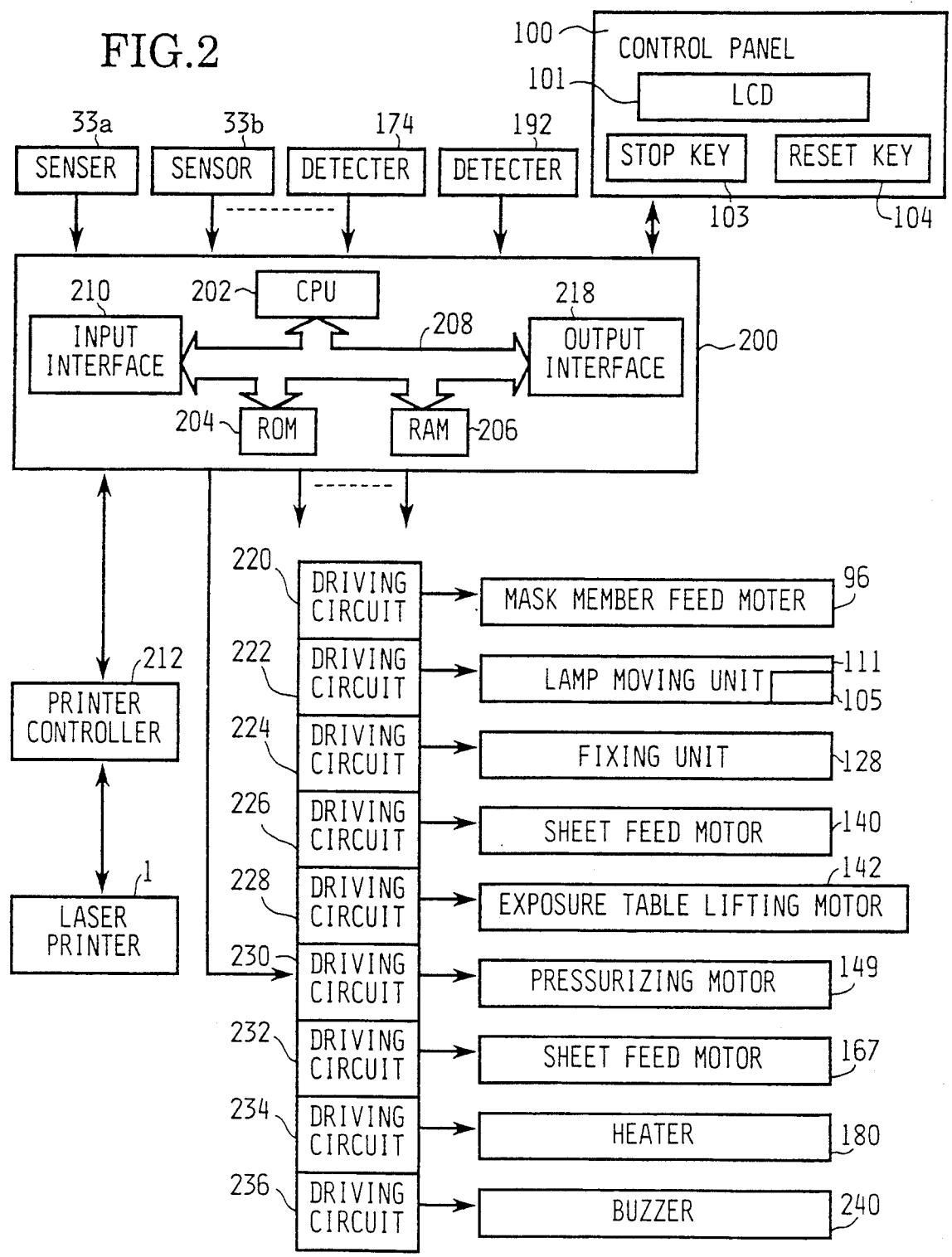
FIG. 2 is a block diagram of a controller for controlling the color image recording apparatus.

When the exposure table 52 is in close contact with the positioning unit 31, the lamp 42 is turned ON, and red light is applied from the red filter 44R through the mask member 15R to the photosensitive recording medium 50 while at the same time it is being scanned by the exposure device 41 in the direction indicated by the arrow A, until the exposure device 41 reaches the position E in FIGS. 4 (a) and 4 (b). The red light exposure data entered by operating the input panel 100 (FIG. 2) is converted by a data converting unit in the controller 200 into equivalent scanning speed data representing a scanning speed of the lamp 42 for red light exposure operation, and then the controller 200 controls the lamp moving unit 111 to drive the scanning motor 105 (which is part of the lamp moving unit 111 as illustrated in FIG. 2) to make the lamp 42 run at the determined scanning speed. After the exposure, the lamp 42 is deenergized, and the exposure device 41 moves back toward the position C in FIGS. 4 (a) and 4 (b) in the direction indicated by the arrow B. When the exposure device 41 is moved from the position C to the home position D, the gear 47d on the support 47a is kept in mesh with the rack 48, rotating the frame 46 and the supports 47a, 47b in the direction indicated by the arrow H in FIG. 4 (b), until the next filter, e.g., the green filter 44G, is positioned below the lamp 42. While the exposure device 41 is moving back, the exposure table 52 is lowered by the cam 53 so that the photosensitive recording medium 50 is spaced downwardly from the positioning unit 31 and the mask member 15R.

At this time, the photosensitive recording medium 50 is held under back tension by the supply roll in the cartridge 51. When the exposure table 52 is lifted, the length of the photosensitive recording medium 50 which corresponds to the upward displacement of the exposure table 52 is drawn out of the cartridge 51. When the exposure table 52 is lowered after exposure, the length of the photosensitive recording medium 50 which corresponds to the downward displacement of the exposure table 52 is withdrawn into the cartridge 51, thereby taking up any sag in the photosensitive recording medium 50.

After the exposure using the red mask member 15R is completed and the descent of the exposure table 52 is confirmed, the feed belt 31a of the positioning unit 31 is moved to deliver the mask member 15R into the circulation guide 25, from which the red mask member 15R is guided by the gate 28 into the upper storage tray 26.

Then, the green mask member 15G generated by the monochromatic laser printer 1 passes through the guide 22, and is guided by the gate 23 into the positioning unit 31 in which the green mask member 15G is positioned with respect to the photosensitive recording medium 50.

If the filter in the operative position of the exposure device 41 as recognized by the controller 200 using the position detector 49 does not correspond to the green mask member 15G at this time as detected by the identifying mark sensors 33b, then the exposure device 41 is operated until the proper filter 44G is positioned below the lamp 42.

Then, the exposure table 52 is elevated to hold the photosensitive recording medium 50 and the green mask member 15G closely against the feed belt 31a, and then the lamp 42 is energized to expose the photosensitive recording medium to green light from the green filter 44G. Following the exposure, the exposure table 52 descends, and the green mask member 15G is guided through the circulation guide 25 and introduced by the gate 28 into the lower storage tray 27. The exposure device 41 moves back, and the frame 46 is rotated to position the blue filter 44B below the lamp 42. As stated above, the green light exposure data entered by operating the input panel 100 is converted into equivalent scanning speed data representing the scanning speed of the lamp 42 for green light exposure operation. The scanning motor 105 drives the lamp 42 according to the scanning speed data.

The blue mask member 15B generated by the monochromatic laser printer 1 is then delivered by the mask member feeder 21 and positioned by the positioning unit 31. Thereafter, the photosensitive recording medium 50 is exposed to blue light by the exposure device 41. Through the above process, a desired colored latent image is formed on the photosensitive recording medium 50.

Then, the exposure table 52 is lowered and the fastening roller 56 is released from the photosensitive recording medium 50, which is then fed by the drive roller 57 in the direction indicated by the arrow C. At this time, the tension roller 55 and the movable guide 64 are in the solid line position. The pressure rollers 71 of the pressure developing unit 70 are spaced from each other. Therefore, while the photosensitive recording medium 50 is being fed and wound up by the takeup roller 54, the microcapsules on the photosensitive recording medium 50 are not damaged or ruptured by contact with these components. The drive roller 57 is stopped when the trailing end of the latent image on the photosensitive recording medium 50 arrives at the pressure roller 71 of the pressure developing unit 70.

In synchronism with the movement of the photosensitive recording medium 50, a color developer sheet 60 is delivered from the cassette 61 by the sheet feed roller 62. The color developer sheet 60 from the cassette 61 is stopped when its leading edge faces the trailing end of the latent image on the photosensitive recording medium 50.

The pressure rollers 71 of the pressure developing unit 70 are then rotated and held against each other by an actuator (not shown), and the photosensitive recording medium 50 is gripped and fastened by the fastening roller 56. The photosensitive recording medium 50 and the color developer sheet 60 which are held in superposed relation to each other are pressed and fed in the direction indicated by the arrow D. At this time, those microcapsules which are not photo-cured on the photosensitive recording medium 50 are ruptured under pressure, and a colored visible image corresponding to the latent image on the photosensitive recording medium 50 is developed on the color developer sheet 60.

As the pressure rollers 71 rotate in the directions indicated by the arrows, the tension roller 55 is moved in the direction indicated by the arrow E, taking up any sag in the photosensitive recording medium 50. While the tension roller 55 moves in the direction indicated by the arrow E, the movable guide 64 is moved by a mechanism (not shown) into the solid-line position to separate the leading edge of the color developer sheet 60 from the photosensitive recording medium 50, and guide the color developer sheet 60 toward the thermal fixing unit 80.

In the thermal fixing unit 80, heat energy is applied to the color developer sheet 60 by the heater 81 through the rotating heat roller 82 and the endless belt 84 to promote color development of the colored image. At the same time, a binder polymer is thermally fused on the color developer sheet 60 for securing the color developers to the base sheet. The color developer sheet 60 is now calendered to the same smoothness as that of the surface of the endless belt 84, so that the color developer sheet 60 has a suitable glossy surface.

After the color developing and calendaring process, the color developer sheet 60 is separated from the endless belt 84 through a curved path, and discharged onto the discharge tray 63.

The mask members can be repeatedly circulated successively into the exposure position by a mask member feeder which has storage trays for storing the mask members separately, a gate for directing the mask members into the storage trays, and a control means for individually feeding the mask members from the storage trays so as to correspond to the colors of the color separation filters of the exposure device. Even if the mask members are inserted in any random order or sequence when a plurality of colored images are to be recorded from the set of mask members, no time is required to change the color separation filters depending on the colors of the mask members to be used when the exposure process is carried out to record the second and following colored images. As a result, color images can be recorded at a high speed.

The operation of the image recording apparatus is controlled by a controller 200 (FIG. 2). A microcomputer comprising a CPU 202, a ROM 204, a RAM 206 and a bus 208 interconnecting these devices is the principal component of the controller 200. An input interface 210 is connected to the bus 208. A monochromatic printer controller 212 for controlling a monochromatic printer 10, an input panel 100 (with stop key 103, reset key 104 and LCD display 101) a pressurizing position detector 174 and a sheet delivery detector 192 are connected to the input interface 210.

Connected to an output interface 218 connected to the bus 203 are driving circuits 220, 222, 224, 226, 228, 230, 232, 234 and 236, which in turn are connected respectively to a mask member feed motor 96, the lamp moving unit 111 which includes the scan motor 105, a fixing unit 128, a photosensitive pressure sensitive sheet feed motor 140; an exposure table lifting unit 142, a pressurizing motor 149, developing sheet feed motor 167, a heater 180 and a buzzer or alarm 240. When a developing sheet 60 is jammed, the buzzer 240 sounds to inform the operator. The jam information and other necessary information are displayed on a LCD display 101 of control panel 100.

The RAM 206 having a work area stores control flags for operating the control process as described below.

Referring to FIG. 2, a stop key 103 is provided to interrupt the image recording operation in the control panel 100. While the basic process control operation is being executed, the controller 200 executes a stop control routine expressed by flow charts shown in FIGS. 3 and 5.

A stop key interrupt routine shown in FIG. 3 is executed when the stop key 103 is depressed. The stop key interrupt routine is ended when a stop key flag is set in step S300.

FIG. 5 shows a main routine to be executed by the image recording apparatus to control an image recording process. In the main routine, steps S410, S420 and S430 represent the contents of a normal process control operation, namely, the foregoing control operations for image recording. This embodiment is characterized in that step S440 and the following steps are executed to remove all the unnecessary sheets from the image recording apparatus and to restore the image recording apparatus to its normal condition without wasting the sheets, when a stop flag is set.

The lamp is operated for three scanning cycles for each image. The stop key flag is checked immediately before each scanning cycle (S440). If the stop key flag is not set, the scanning process (S420) and the following processes are executed, and steps S410 to S430 are repeated by a necessary number of times.

If the stop key flag is set, a mask member ejecting process (S450) is executed to eject all the mask members 15R, 15G, 15B into the discharge tray 30 from places where the mask members 15R, 15G, 15B may be present, namely, the mask member positioning unit 31, the first upper tray 26 and the second lower tray 27. The control 200 operates the mask feed motor 96 and gates 23 and 28 to direct the mask members 15R, 15G and 15B to the discharge tray 30.

A query is made to see if a photosensitive recording medium 50 in the exposure zone 41 has been subjected to at least one exposure cycle (S460). Since the number of executed exposure cycles is counted by an exposure cycle counter included in the RAM 206 during the process control operation (S410, S430), the contents of the exposure counter is checked. When the response in step S460 is negative, the photosensitive recording medium 50 placed in the exposure zone 41 is held as it is.

When the response in step S460 is affirmative, a photosensitive recording medium ejecting process is executed (S470) to eject the photosensitive recording medium 50. The photosensitive recording medium 50 staying in the exposure zone 41 and carrying an incomplete latent image is moved toward the winding roller 54 to remove the same from the exposure zone, and a new photosensitive recording medium 50 is supplied to the exposure zone.

Then, a query is made to see if the pressure developing process is in progress (S480), namely, if a photosensitive recording medium 50 and a developing sheet 60 are joined together and are pressed between the pressure rollers 71 for developing in the pressure developing unit 70. The controller 200 checks the position of the developing sheet 60 continuously by using the output signals of the pressing position sensor 174 and the sheet ejection sensor 192. The pressure developing process is in progress when the output signal of either the pressing position sensor 174 or the sheet ejection sensor 192 is high.

When the response in step S480 is negative, namely, if the developing sheet 60 has not been fed to the pressure developing unit 70, the subsequent step is executed. When the response in step S480 is affirmative, a developing completion process (S490) is executed, in which the pressure developing unit 70 and other relevant units are driven until the output signals of both the pressing position sensor 174 and the ejection sensor 192 go low and the developing sheet 60 is transferred to the discharge tray 63 to complete the pressure developing process.

Subsequently, an initializing process (S500) is executed to restore the photosensitive recording medium 50 to its initial state. For example, when the pressure developing process is completed by executing step S490, the used photosensitive recording medium 50 is stored near the tightening roller 55 as indicated in phantom by alternate long and two short dashed lines in FIG. 1. In such a case, the used photosensitive recording medium 50 is transferred to the takeup roller 54 and a new photosensitive recording medium 50 is fed to prepare for the subsequent image recording operation.

Then, the stop key flag is reset (S510) to end the routine, and then the control operation returns to a key input routine, not shown, to wait for the key input operation of the operator.

Thus, the stop key flag is set when the stop key 103 is depressed, the stop key flag is checked immediately before each scanning cycle, and the sheet ejecting process is executed when the stop key flag is set.

At a moment immediately before each scanning cycle, the sheets, particularly, the mask members 15R, 15G, 15B, are in the first tray 26, the second tray 27 or the mask member positioning unit 31. Accordingly, the sheet ejecting operation is never started while the sheets are being transferred. Therefore, the sheet ejecting operation can surely be carried out and the sheets are never jammed in the image recording apparatus. If the sheet ejecting operation is started while the sheets are being transferred, it is possible that the mask members 15R, 15G, 15B are caught by the direction changeover devices 23 and 28. If the mask members 15R, 15G, 15B are caught accidentally by the direction changeover devices 23 and 28, the image recording apparatus must by stopped by opening the main switch or the cover-open switch to remove the sheets remaining within the image recording apparatus by hand. This embodiment eliminates such troubles.

Thus, all the mask members 15R, 15G, 15B are ejected to complete preparation for receiving the next set of mask members 15R, 15G, 15B.

In the photosensitive recording medium ejecting process (S470), if at least the first exposure cycle has been carried out, the subsequent exposure cycles are canceled and the photosensitive recording medium 50 which has been subjected at least to the first exposure cycle is ejected to avoid double exposure and using the photosensitive recording medium for the subsequent image recording cycle. When any exposure cycle has not been carried out, the photosensitive recording medium 50 is not ejected to save the same for the subsequent image recording cycle.

If the image recording operation is interrupted after the pressure developing process has been started, the pressure developing process is completed to avoid the photosensitive recording medium 50 and the developing sheet 60 adhering to each other. When the image recording operation is interrupted before starting the pressure developing process, the developing sheet 60 is not ejected to save the same for the subsequent image recording cycle.

In this embodiment, the stop key flag is checked (S440) immediately before each scanning cycle (S420), but the stop key flag may be checked immediately after each scanning cycle (S420) or may be checked (S440) both immediately before and immediately after each scanning cycle.

The stopping process (steps S450 to S510) may be executed upon the depression of the stop key 103; that is, in the stop key interrupt routine shown in FIG. 3, steps S450 to S510 may be executed instead of step S300.

In this embodiment, the stop key flag is set upon the depression of the stop key 103, but the stop key flag may be set also upon the depression of other keys such as a reset key 104.

The image recording apparatus in accordance with the present invention ejects the original sheet by the original sheet ejecting means, and an unused photosensitive recording medium and an unused developing sheet are kept by the photosensitive recording sheet changing means and the recording medium changing means. Thus, all the wrong sheets are ejected from the image recording apparatus and unused sheets are saved for the subsequent image recording operation, so that the sheets are not wasted and the image recording operation can smoothly be restarted.

As described above, the color image recording apparatus 20, comprises an exposing unit 41 for exposing a photosensitive recording medium 50 to light through a succession of mask members 15R 15G, 15B prepared based on colored image information to form an image on the photosensitive recording medium 50, a stop signal input unit 103 for inputting a stop signal to interrupt the image recording operation, a mask member ejecting control unit 202 for ejecting all the mask members 15R 15G, 15B from the exposing unit 41 when the stop signal input unit provides a stop signal, a photosensitive recording medium changing controlling unit 202 for changing the photosensitive recording medium for a new one if the latent image forming process has been started by said exposing unit 41 before the stop signal is provided by the stop signal input unit 103.

While the invention has been described in detail and with reference to specific embodiment thereof, it would be apparent for those skilled in the art that various changes and modifications can be made therein without departing from the spirit and scope of the invention.

WHAT IS CLAIMED IS:

1. A color image recording apparatus comprising;
    exposing means for exposing an unexposed photosensitive recording medium to light through a succession of mask members prepared based on colored image information to record an image on the unexposed photosensitive recording medium to form an exposed photosensitive recording medium in an image recording operation;
    photosensitive recording medium changing means for changing the exposed photosensitive recording medium for an unexposed photosensitive recording medium;
    stop signal input means for inputting a stop signal to interrupt the image recording operation of the exposing means;
    mask member ejecting means responsive to the stop signal input means for ejecting all the mask members from the exposing means in response to the stop signal from the stop signal input means; and
    photosensitive recording medium changing controlling means responsive to the stop signal input means for actuating said photosensitive recording medium changing means to change the photosensitive recording medium if the image recording operation of the exposing means is actuated before the stop signal is provided by the stop signal input means.

2. A color image recording apparatus as claimed in claim 1, wherein said photosensitive recording medium changing controlling means controls said photosensitive recording medium changing means to hold the photosensitive recording medium in the exposing means if the image recording operation has not been started by said exposing means before the stop signal is provided by the stop signal input means.

3. A color image recording apparatus comprising;
    exposing means for exposing an unexposed photosensitive recording medium to light through a succession of mask members prepared based on colored image information by an image recording operation to record a latent image on the unexposed photosensitive recording medium to form an exposed photosensitive recording medium;
    developing means for developing the latent image on the exposed photosensitive recording medium into a colored visible image on an undeveloped recording medium to form a developed recording medium in a developing operation;
    recording medium changing means for changing the developed recording medium for an undeveloped recording medium;
    stop signal input means for inputting a stop signal to interrupt the image recording operation of the exposing means and the developing operation of the developing means;
    mask member ejecting means responsive to the stop signal input means for ejecting all the mask members from the exposing means in response to a stop signal from the stop signal input means; and
    recording medium changing control means responsive to the stop signal input means for controlling the recording medium changing means to change the recording medium if the developing operation has been started by said developing means when the stop signal is provided by the stop signal input means.

4. A color image recording apparatus as claimed in claim 3, wherein the recording medium changing controlling means controls the recording medium changing means to hold the recording medium in the developing means if the developing operation has not been started by said developing means when the stop signal is provided by the stop signal input means.

5. A color image recording apparatus comprising;
    exposing means for exposing an unexposed photosensitive recording medium to light through a succession of mask members prepared based on colored image information to record a latent image on the unexposed photosensitive recording medium to form an exposed photosensitive recording medium in an image recording operation;
    photosensitive recording medium changing means for changing the exposed photosensitive recording medium for an unexposed photosensitive recording medium;
    developing means for developing the latent image on the exposed photosensitive recording medium into a colored visible image on an undeveloped recording medium a developing operation to form a developed recording medium;
    recording medium changing means for changing the developed recording medium for an undeveloped recording medium;
    stop signal input means for inputting a stop signal to interrupt the image recording operation and the developing operation;
    mask member ejecting means responsive to the stop signal input means for ejecting all the mask members from the exposing means in response to the stop signal from the stop signal input means;
    photosensitive recording medium changing controlling means responsive to the stop signal input means for controlling the photosensitive recording medium changing means to change the photosensitive recording medium if the image recording operation has been started by the exposing means before the stop signal is provided by the stop signal input means;
    the photosensitive recording medium changing controlling means further controlling the photosensitive recording medium changing means to hold the photosensitive recording medium in the exposing means if the image recording operation has not been started by said exposing means before the stop signal is provided by the stop signal input;
    recording medium changing control means for controlling the recording medium changing means to change the recording medium if the developing operation has been started by said developing means when the stop signal is provided by the stop signal input means; and
    the recording medium changing control means further controlling the recording medium changing means to hold the recording medium in the developing means if the developing operation has not been started by said developing means when the stop signal is provided by the stop signal input means.

6. A method for controlling a color image recording apparatus having exposing means for exposing an unexposed photosensitive recording medium to light through a succession of mask members prepared based on colored image information to record an image on the unexposed photosensitive recording medium in an image recording operation to form an exposed photosensitive recording medium; photosensitive recording medium changing means for changing the exposed photosensitive recording medium for an unexposed photosensitive recording medium; developing means for developing the image on the exposed photosensitive recording medium into a colored visible image on an undeveloped recording medium in a developing operation to form a developed recording medium; and recording medium changing means for changing the developed recording medium for an undeveloped recording medium, the method comprising the steps of:

detecting a stop signal;

interrupting the image recording operation in response to detecting the stop signal; and ejecting the mask members from the exposing means in response to the stop signal.

7. The method of claim 6, further comprising the steps of:

actuating the photosensitive recording medium changing means to change the photosensitive recording medium when the image recording operation starts before detection of the stop signal.

8. The method of claim 6, further comprising the step of holding the photosensitive recording medium in the exposing means when the stop signal is detected before the image recording operation is started.

9. The method of claim 6, further comprising the steps of:

interrupting the developing operation of the developing means in response to detection of the stop signal; and actuating the developer recording medium changing means to change the recording medium when the developing operation starts before detection of the stop signal.

10. The method of claim 6, further comprising the step of:

holding the recording medium in the developing means when the stop signal is detected before starting the developing operation.

11. The method of claim 6, wherein the detection of the stop signal is determined before the exposing means begins the image recording operation to avoid interruption of the image recording operation while moving the mask members to an exposure zone in the exposing means.

12. The method of claim 6, wherein the detection of the stop signal is determined after the exposing means completes the image recording operation to avoid interruption of the image recording operation while moving the mask members to an exposure zone in the exposing means.

13. An apparatus for controlling a color image recording device having exposing means for exposing an unexposed photosensitive recording medium to light through a succession of mask members prepared based on colored image information to record an image on the unexposed photosensitive recording medium in an image recording operation to form an exposed photosensitive recording medium; photosensitive recording medium changing means for changing the exposed photosensitive recording medium for an unexposed photosensitive recording medium; developing means for developing the image on the exposed photosensitive recording medium into a colored visible image on an undeveloped recording medium in a developing operation to form a developed recording medium; and recording medium changing means for changing the developed recording medium for an undeveloped recording medium, the apparatus comprising:

means for detecting a stop signal;

control means for interrupting the image recording operation in response to detecting the stop signal; and ejection means responsive to the control means for ejecting the mask members from the exposing means in response to the stop signal.

14. The apparatus of claim 13, wherein the control means includes:

means for actuating the photosensitive recording medium changing means to change the photosensitive recording medium when the image recording operation starts before detection of the stop signal.

15. The apparatus of claim 13, wherein the control means includes:

means for controlling the photosensitive recording medium changing means to hold the photosensitive recording medium in the exposing means when the stop signal is detected before the image recording operation is started.

16. The apparatus of claim 13, wherein the control means includes:

means for interrupting the developing operation of the developing means in response to detection of the stop signal; and means for actuating the recording medium changing means to change the recording medium when the developing operation starts before detection of the stop signal.

17. The apparatus of claim 13, wherein the control means includes:

means for controlling the recording medium changing means to hold the recording medium in the developing means when the stop signal is detected before starting the developing operation.

* * * * *